United States Patent [19]

Trampert

[11] Patent Number: 5,072,186

[45] Date of Patent: Dec. 10, 1991

[54] METHOD AND APPARATUS FOR INTERTURN AND/OR INTERLAYER FAULT TESTING OF COILS

[75] Inventor: Wolfgang Trampert, Baiersdorf, Fed. Rep. of Germany

[73] Assignee: Siemens Aktiengesellschaft, Berlin & Munich, Fed. Rep. of Germany

[21] Appl. No.: 473,419

[22] Filed: Feb. 1, 1990

[30] Foreign Application Priority Data

Feb. 15, 1989 [DE] Fed. Rep. of Germany ....... 3904553

[51] Int. Cl.⁵ .......................................... G01R 31/06
[52] U.S. Cl. ................................... 324/546; 324/653
[58] Field of Search ............... 324/546, 547, 653, 654, 324/652, 655, 537

[56] References Cited

U.S. PATENT DOCUMENTS

| | | | |
|---|---|---|---|
| 2,759,146 | 8/1956 | Heinz | 324/653 X |
| 3,181,803 | 5/1965 | Warburton et al. | 326/655 X |
| 3,667,034 | 5/1972 | Freeze | 324/546 X |
| 3,855,554 | 12/1974 | Müller | 324/655 X |

Primary Examiner—Kenneth A. Wieder
Assistant Examiner—Robert W. Mueller
Attorney, Agent, or Firm—Kenyon & Kenyon

[57] ABSTRACT

An electric coil to be tested for interturn and/or interlayer faults is coupled into a series resonant circuit. A measurement of the quality-factor (Q-factor) is carried out by measuring the overshoot voltage in circuit resonance. Through the selection of a suitable capacitance in the series resonant circuit, the resonant frequency can be placed in a range in which the quality-factor of the coil attains its maximum value. The coil to be tested is therefore a component of a series resonant circuit. The measuring system for determining the quality-factor of the coil is low capacitively coupled into the resonant circuit. Because the interturn resistance of the test coil must be measured in any event, since this value is also obtained during Q-factor measurement, the necessary operating and measuring periods can be optimized.

14 Claims, 5 Drawing Sheets

METHOD AND APPARATUS FOR INTERTURN AND/OR INTERLAYER FAULT TESTING OF COILS

FIELD OF THE INVENTION

The invention relates to a method of testing electric coils (test piece) for interturn and/or interlayer faults and, more particularly, to a corresponding device for the implementation of this method. The device includes a series resonant circuit whose component is the coil to be tested, i.e., the test piece, a generator for the generation of a variable frequency voltage and a measuring system for recording the quality factor (Q-factor) of the coils.

BACKGROUND OF THE INVENTION

In almost all cases today, coils for electrotechnical applications are wound during mass production. Because the wound enamel-insulated wires can exhibit defects, the occurrence of an interturn or even an interlayer fault cannot be overlooked. Interturn faults remaining undetected in the course of production can possibly cause long-term coil failure. Therefore, within the scope of quality assurance, it is necessary for the ready-wound coils to undergo a test for interturn and/or interlayer faults. Several measuring methods, following very diverse physical principles, can be used for this purpose.

In previous practice, customary measuring methods operate, for example, according to the principles of an a.c. voltage measuring bridge or an impulse voltage testing method. Measuring instruments produced according to these principles operate satisfactorily when the coils have only a small number of turns. However, when the coils have a large number of turns, the prior known instruments prove unreliable due to the parasitic coil capacitance or the minimal measuring effect caused by an interturn fault.

Due to the fact that increasingly higher demands are placed on coils, any interturn faults across a turn must be reliably detected. This is particularly true for coils having a very high number of turns. The measuring method must also be suitable for application in a flexible, large-scale coil production.

A method and apparatus for testing coils for interturn and/or interlayer faults is known from DE-PS 910 092 and DE-AS 26 44 253. In these references, the coil to be tested slides onto adjacent arms of U-shaped cores. Magnetic induction induced therein is used for measuring the short-circuited windings of any faulty coils. An advantage of these devices is that contact is not made with the coils that are tested. However in practice, contacting the coil connections is necessary in many cases during the course of quality control. For example, contacting is required for measuring copper wire resistance. Therefore, contact is generally included in the test of the coils anyway.

There is therefore needed other methods with which a winding test can be performed without any problems.

SUMMARY OF THE INVENTION

The present invention provides a method and apparatus for interturn and/or interlayer fault testing of coils. The test coil is coupled into a series resonant circuit and a measurement of the quality-factor (Q-factor) is carried out. The measurement is performed by recording the overshoot voltage at resonance of the resonant circuit whereby the resonant frequency is place in a range such that the Q-factor of the coil attains its maximum demand level by selecting a suitable capacitance in the series resonant circuit.

In the instant invention, contact must be made with the test coil. However, applying the measuring method of the invention, contact is made with the coil connections in any case. Interturn resistance also arises during the quality-factor measurement, so that the operation and measuring times for concurrent measurement are optimized.

The present invention shows that, observing the marginal conditions above, the measurement of the Q-factor of the coil is suitable to detecting interturn faults. This is particularly true because the tolerance deviation influence of the interturn resistance on the Q-factor is offset.

The measuring of the quality factors are known from the prior art referenced above. It is important in the instant invention that the measuring frequency be place in a range at which the quality factor of the coil reaches its maximum level. This is done through the appropriate choice of a capacitor. Consequently, measurements are taken at variable frequencies in a frequency range specific to the test piece, such that, at least for coils having a large number of turns, e.g., up to 17,000, a precise enough signal is obtained at one single turn short circuit. In this manner, measurements are performed at widely varying measuring frequencies, e.g., in a range between 500 Hz and 100 kHz. When the measuring value deviates from a predetermined limiting value, an interturn fault error signal can be emitted by comparing the quality-factor of the test piece registered at the appropriate or suitable measuring frequency with a previously-recorded quality measurement of a standard coil, e.g. a faultless coil similar to the test piece.

In the apparatus which implements the method using a series resonant circuit having a test coil as the apparatus' component and a known measuring system for recording the coil quality-factor of the coil, the measuring system is coupled low-capacitance into the resonant circuit. Preferably, the variable frequency generator is coupled low-resistance to the resonant circuit.

It is an advantage of the invention to provide an automated test procedure by using a suitably developed measuring system. Corresponding software refinement by means of a personal computer makes the system fully automatic, particularly for the selection of suitable resonance capacitances for use in the series resonant circuit.

The present invention has been demonstrated to reliably detect interturn faults across one single turn even for the case of coils having up to 17,000 turns. Thereby, the necessary testing period amounts to approximately 3.5 seconds. The mesauement of the temperature-compensated resistance value is included in this period. Depending upon the stringency of the test and the suitability of the capacitance selection made by the personal computer (PC) also used in the evaluation, the test period may be further reduced to approximately 1.5 seconds.

BRIEF DESCRIPTION OF THE INVENTION

DETAILED DESCRIPTION

The method of the invention is based on a modified quality-factor measurement process for coils. To determine the quality-factor of the coil, the inductor test piece, i.e., coil, is coupled into a series resonant circuit with a capacitor. The quality-factor of the resonant circuit is determined by the quality-factors of the capacitor on the one hand and by the coil on the other hand. Because the quality-factor of the coil is considerably less than the quality-factor of the capacitance, the quality-factor measurement of the coil can be attributed to the measurement of the quality-factor of the resonant circuit quality. In this manner, the quality-factor of the coil alone is able to be determined by the measurement of the overshoot voltage in the series resonant circuit at resonance.

In order to more fully understand the measuring system, the following concepts are explained below:

In a series resonant circuit including a coil and capacitor, the voltage values on the coil and the capacitor, depending upon the frequency, reach their maximum demand level near the resonant frequency. Generally it holds that:

$$|U_L| = |U_C| = U_O \cdot Q \quad (1)$$

The circuit quality-factor $Q$ also be represented as the value of the electrical loss factor $\delta$. In the case of a series resonant circuit, the electrical loss factor is calculated from the sum of the loss factors of the coil ($\delta_L$) and the capacitor ($\delta_C$). It holds that:

$$Q = \frac{1}{\tan \delta_L + \tan \delta_C} = \frac{1}{\tan \delta_{ges}} \quad (2)$$

Because the loss factor of the circuit capacitors is more than a power of ten less than that of the test coils, the circuit quality-factor $Q$ can be exclusively represented by the quality-factor of the coil for all practical purposes. Therefore, the quality-factor of the coil is dependent mainly on the resistance of the coil ($R_{CU}$) and on the eddy current ($R_W$) losses. It holds that:

$$\tan \delta_L = \tan \delta_{CU} + \tan \delta_W \quad (3)$$

$$\tan \delta_L = \frac{R_{CU}}{\omega \cdot L} + \frac{R_W}{\omega \cdot L} \quad (3.1)$$

It can be seen that an interturn fault leads to an increase of $R_W$ and thus to a decrease in the circuit quality-factor $Q$. When the temperature-dependent and resistance limit of the copper wires is offset, an interturn fault can be detected by measuring the quality-factor of the circuit.

Figure 1:
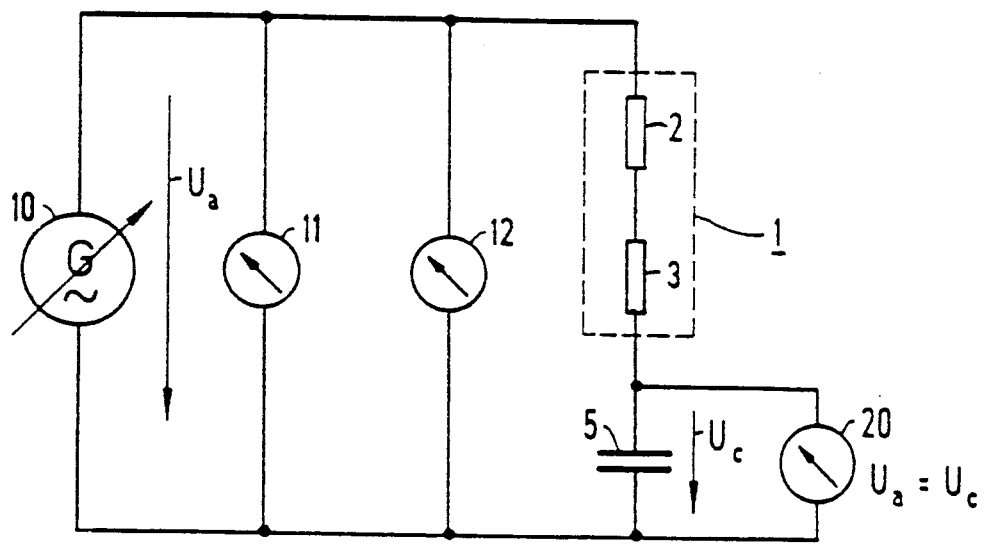
FIG. 1 is a schematic circuit diagram of the testing device.

Referring to the schematic measuring arrangement shown in FIG. 1, test piece 1 includes an inductance portion 2 and an ohmic resistance portion 3. A capacitor 5 having capacitance C is coupled in series with the test piece 1. The resonant circuit (coil 1 and capacitor 5) is excited by a selective frequency generator 10. The measuring frequency f and the voltage $U_O$ are coupled in parallel across corresponding measuring instruments 11 and 12. The overshoot voltage resulting from a resonant circuit is picked off at capacitor 5 and is measured with a precision measuring instrument 20.

The following equations show that the measurement of the circuit quality can be attributed to the measurement of the rise in voltage on capacitor 5. According to the known relationships of electrotechnology, the following equation holds for the voltage of the capacitor 5:

$$|U_C| = |U_O| \cdot \frac{1}{\sqrt{(\omega \cdot C \cdot R)^2 + (1 - \omega^2 \cdot L \cdot C)^2}} \quad (4)$$

The frequency for the maximum demand voltage on capacitor 5 is determined through the differentiation of equation (4):

$$\omega_{UC} = 2\pi f = \omega_o \cdot \sqrt{1 - \frac{1}{2Q^2}} \text{ with } \omega_0 = \frac{1}{\sqrt{L \cdot C}} \quad (5)$$

The maximum demand level of the voltage, in the case for the frequency according to equation (5), thus yields:

$$\frac{|U_{C\,Max}|}{|U_o|} = \frac{Q}{\sqrt{1 - \frac{1}{4 \cdot Q^2}}} \approx Q \quad (6)$$

Because the square root in Equation (6) can be ignored for $Q > 5$, the same statement results as in equation (1). Thus, it can be proved that the circuit quality measurement and thus also the coil quality measurement can take place simply by recording the overshoot voltage on capacitor 5 in the equivalent circuit diagram according to FIG. 1.

Figure 2:
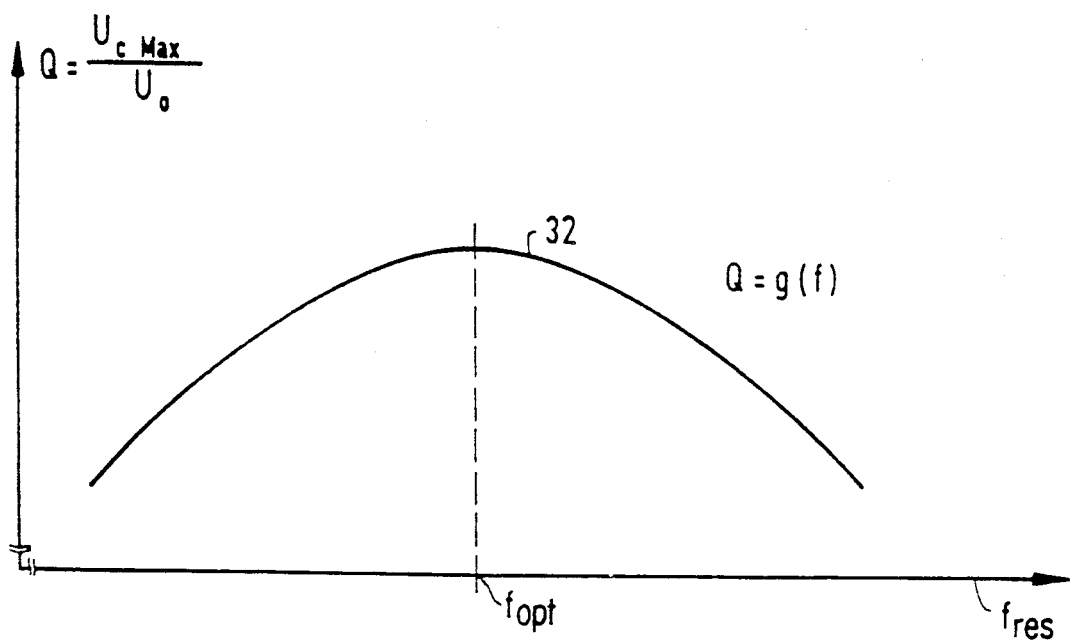
FIG. 2 is a diagram explaining the selection of the measuring frequency.

In FIG. 2, the dependency of the coil quality Q on the frequency f is clearly shown. The quality-factor Q of the coil is plotted in arbitrary units as the ordinate. The Q-factor of the coil is a function of the resonant frequency f which is plotted as the abscissa. It is recognized that, corresponding to curve 32, signal $Q = g(f)$ varies with the frequency and, at a specified value, traverses a distinct maximum demand level. This frequency $f_{opt}$ is dependent upon the type of test piece and can lie in a range between 500 Hz and 100 kHz.

The occurrence of an interturn fault at frequency $f_{opt}$ demonstrates that the amount of reduction in coil quality is at its maximum. Thus, specifying an indication of an interturn and/or interlayer fault is greatest at $f_{opt}$. Therefore, the measurements are taken at this optimum frequency. For this purpose, an optimum adjusted capacitance is coupled into the resonant circuit with the test piece. This adjusted capacitance is chosen from a multitude of parallel-coupled capacitors.

Figure 3:
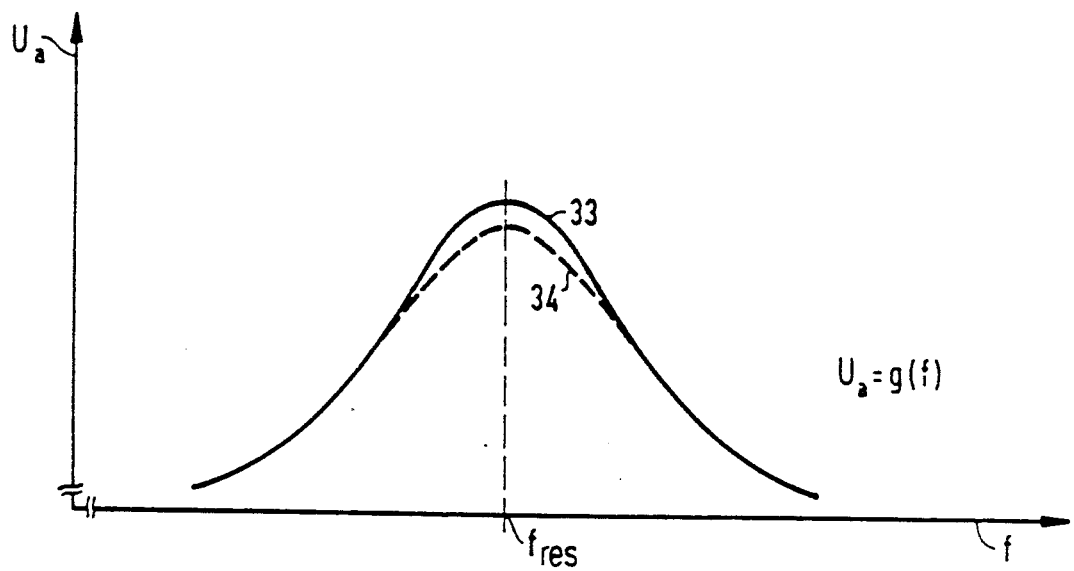
FIG. 3 is a diagram explaining the selection of the measuring frequency.

The qualitative progression of the voltage $U_C$, measured on the capacitor 5 in the series resonant circuit, is shown in FIG. 3 as a function of the frequency. Through selection of a suitable capacitor 5, it is ensured that the frequency $f_{opt}$, from FIG. 2, will coincide with the frequency $f_{res}$. The curve 33 shows the function $U_C = h(g)$ in a coil without an interturn fault. The curve 34, however, shows the same function in a coil having an interturn fault. Therefore, a clearly identifiable signal results when a coil is defective.

Figure 4:
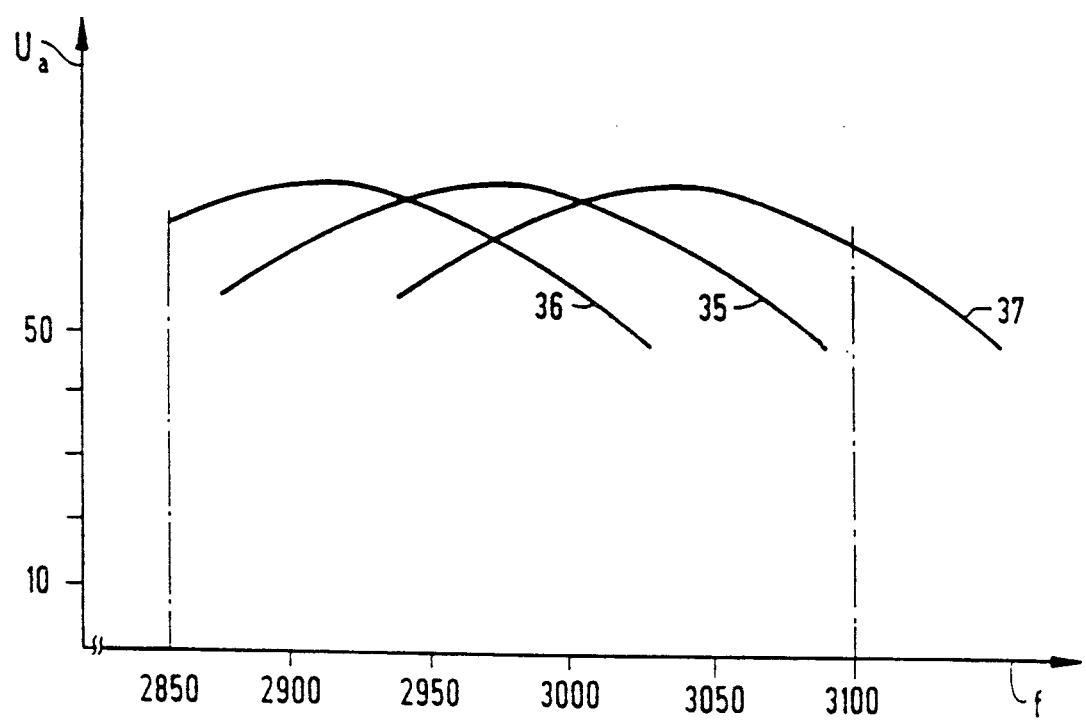
FIG. 4 is an enlarged segment of FIG. 3 for a specific type of coil.

It is theoretically observed that, according to FIG. 3, a displacement of the curve can arise in a random test coil as a function of its inductance L and capacitance $C_L$. FIG. 4 shows an enlarged segment from FIG. 3 in the application of a coil of a special type having a large number of turns n, e.g. n=17,000. For example, in this case, the maximum demand level of the standard coil lies at approximately f=2970 Hz, corresponding to curve 35. Should L or $C_L$ become greater, f would be shifted to lower frequencies corresponding to curve 36; should L or $C_L$ become smaller, f would conversely be shifted to higher frequencies corresponding to curve 37. However, in both cases, the absolute value of the maximum demand level would remain at the same level as in curve 35.

As a result of an interlayer and/or interturn fault, however, the absolute value of the voltage in the maximum demand would change, corresponding to curve 34 shown in FIG. 3.

The curves 36 and 37 in FIG. 4 represent limiting values for the minimum and/or maximum inductances and/or capacitances of the circuit. All of the coils of the above-mentioned type occurring in practice lie within the range of these limiting curves. The adjusted measuring frequency range for the specific example therefore extends from approximately 2850 to 3100 Hz.

For a batch test, the optimum measuring frequency must first be determined once on a standard coil that is similar to the test piece type. During the batch test, the measuring frequency is then varied. The voltage on the capacitor is measured at the same time and the value of the maximum voltage is evaluated. Within the optimum measuring range, the absolute value of the voltage maximum demand level, and thus also the circuit quality, can clearly indicate whether or not an interturn fault is present.

Figure 5:
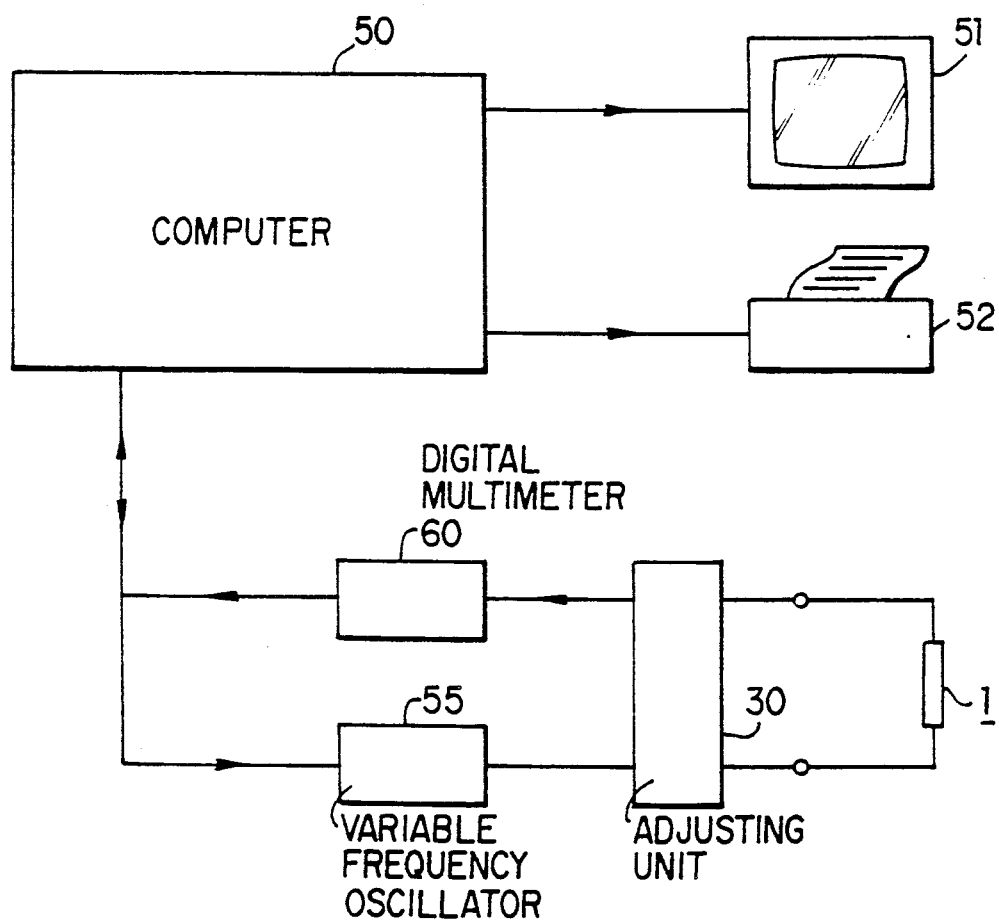
FIG. 5 is a block diagram of the entire measuring system including a personal computer for controlling the measurement sequencing and evaluation of the measuring data.

In FIG. 5, a measuring device according to FIG. 1 is coupled with a measuring system chiefly consisting of: a personal computer (PC) 50 having appropriate peripherals such as a monitor 51 and a printer 52; a variable frequency oscillator 55; and a digital multimeter 60. The oscillator 55 serves to synthesize variable frequency voltages and is controlled during the measuring run by the PC 50. Furthermore, an adaptor unit 30 is present. The adaptor unit 30 allows for a low-resistance coupling of the generator 55 into the resonant circuit and a low-capacitance uncoupling of the measuring signal. In practice, buffer amplifiers are used in the adaptor circuit 30.

The test sequence is controlled by suitable selection of software in a manner such that the optimum measuring parameters are automatically retrieved and adjusted for operation with the coupled system. After measurement has started, the PC 50 controls the recording and evaluation of the measured values and provides the final result to the indicator 51, 52. Besides processing the measured values, the PC 50, in particular, can also store the preselected nominal values. In addition, a statistical evaluation of the measured values is possible for mass production applications.

Figure 6:
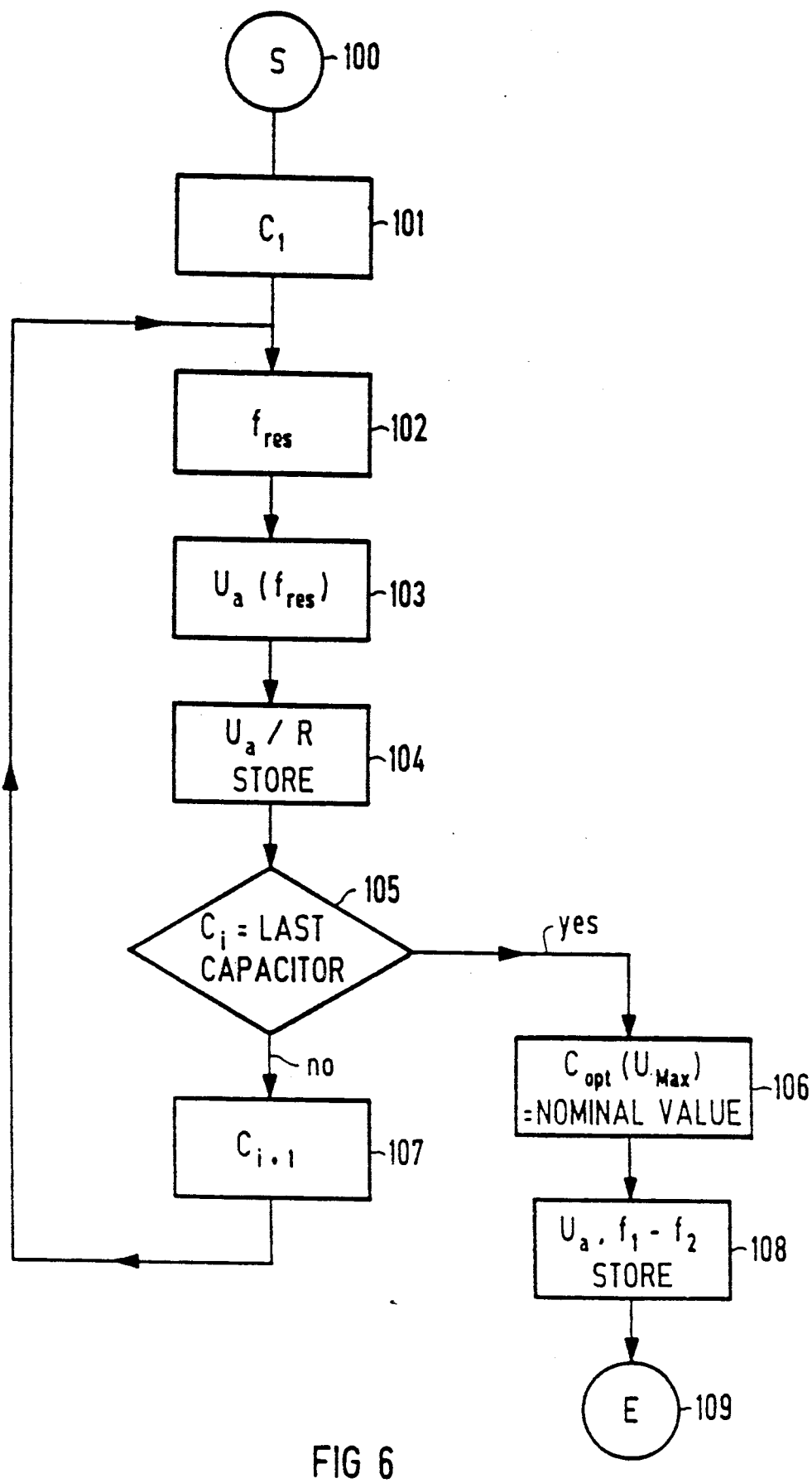
FIG. 6 is a flow chart clarifying the fully automatic detection of the measuring parameters.
Figure 7:
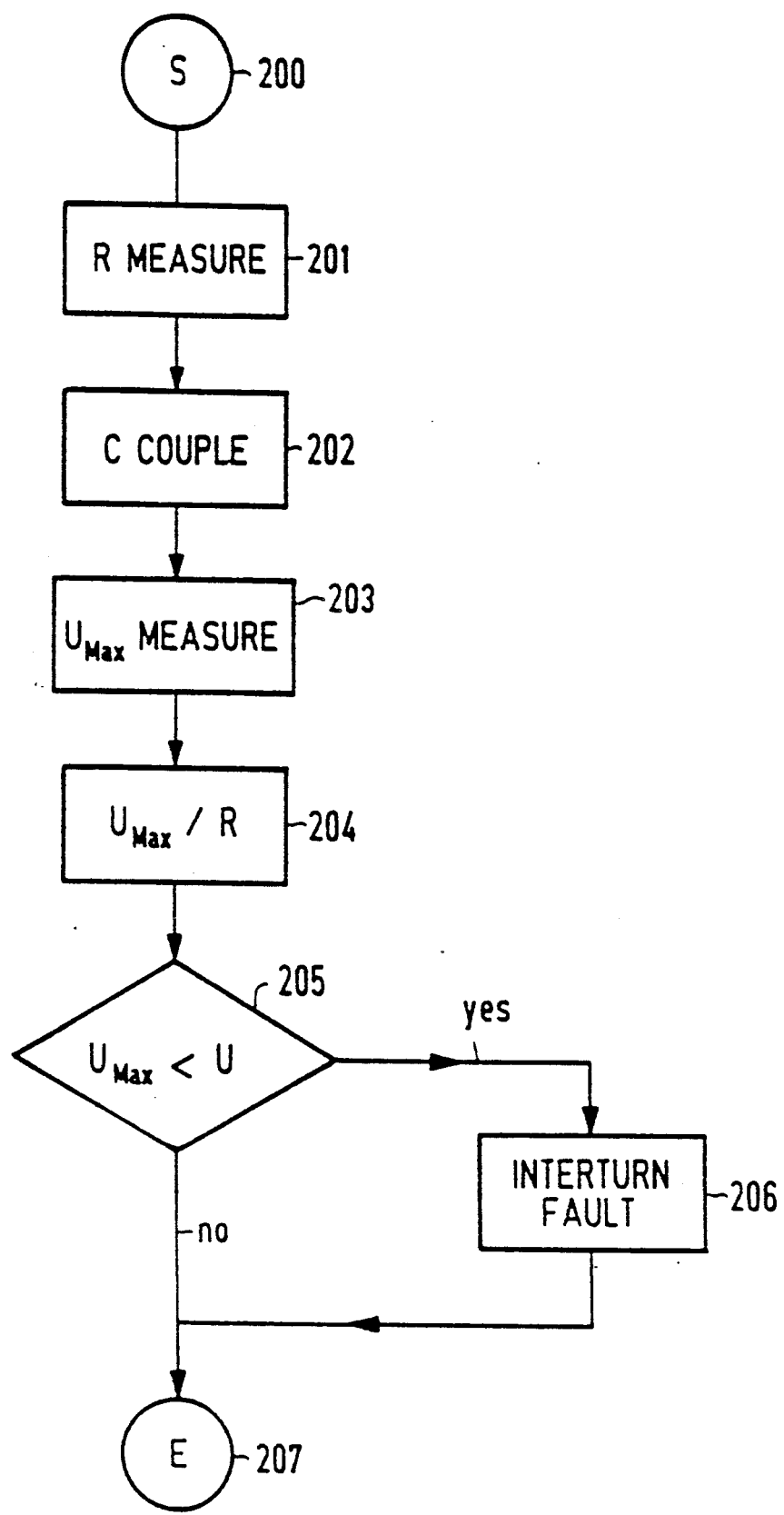
FIG. 7 is a flow chart clarifying the bath test.

The interturn fault test corresponds to the flow charts shown in FIG. 6 and FIG. 7. FIG. 6 shows the automatic one-time determination of the optimum measuring parameters, whereas FIG. 7 shows the actual measuring sequence that is carried out for each test piece during the batch test. According to the usual flow chart practice, sequence steps are designated by rectangles and decision steps by diamonds.

The illustration in FIG. 6 begins with the assumption that the resonant frequency of the series resonant circuit, formed from the selectively switchable capacitance and inductance of the test piece, lies for example in the frequency range between 500 Hz and 100 kHz. After starting 100, the first capacitor $C_1$ is preselected in sequence step 101 and the resonant frequency is subsequently sought for the resonant circuit equipped with this capacitor $C_{102}$. The maximum demand voltage level U is determined in sequence step 103. In sequence step 104, the measured volta $U_a$ is referenced to the nominal resistance and is stored.

Decision step 105 verifies which capacitor having the available capacitance $C_1$ was preselected. Should the last capacitor have been preselected, then according to sequence step 106, the optimum capacitor is determined through evaluating the measured voltage and is accepted as the nominal value. Conversely, if the last capacitor has not been preselected, then according to sequence step 107, the next capacitor $C_1$ is preselected and returned to position 102. The sequence steps are then again run through the corresponding loop.

The optimum capacitance at which a maximum Q-factor of the coil exists can be determined from the available capacitors with capacitances $C_1$ using the above procedure. The voltage U measured at this capacitor and the frequency range f1 to f2 is then stored as nominal values according to sequence step 108. At position 109, the partial sequence for the single determination of the measuring parameter for a test piece ends.

The measuring sequence according to FIG. 7 is started at position 200. The interturn resistance is first measured at sequence step 201. At position 202, the predetermined capacitor for this type of test piece having capacitance $C_1$ is coupled into the series resonant circuit. At sequence step 202, the series resonant circuit is excited and thereby the maximum voltage is determined. This voltage is referenced to the nominal resistance according to sequence step 203. In decision step 205, a test is performed as to whether the recorded voltage and thus also the quality of the test piece lies within the tolerance range, whereby the maximum voltage value is compared with the preselected nominal value. If the measured value is less than the nominal value, then an interturn fault is determined according to position 206. The measurement sequence ends at position 207.

A batch testing of coils, according to the flow charts of FIGS. 6 and 7, can be modified in various respects. Modification is easily performed through software changes. In each case, the user of the device can directly obtain on the PC monitor 51 a statement about the quality of the coil and the eventual presence of an interturn fault.

The batch test can be carried out without any difficulty by untrained personnel. This is due to the fully-automated measurement process. Although the unavoidable process tolerances of the test coil pieces have no influence on the measuring results and although each test piece is tested at its optimum measuring parameters, the measuring period is still kept short. Since in the course of the interturn fault test, the temperature and the interturn resistance must be measured in any case, no otherwise special measurement of these amounts is necessary. In this manner, the necessary operation and testing periods can be optimized.

Since a PC is utilized in the test control sequence, all measurement values that occur can readily be subjected to a statistical evaluation.

What is claimed is:

1. A method for testing an electric coil test piece for interturn and interlayer faults, the method comprising the steps of:
    a) coupling said electrical coil test piece in a series resonant circuit;
    b) performing a measurement of the quality-factor Q by measuring an overshoot voltage when the resonant circuit is in resonance;
    c) performing step (b) with a frequency of the resonant circuit in a range using a selected value of a capacitance of the series resonant circuit, whereby the selected value of the capacitance allows the quality-factor Q to attain a maximum.

2. The method according to claim 1 wherein the step (b) of performing the measurement comprises changing an excitation frequency to a new frequency for the series resonant circuit; and
    determining the overshoot voltage at the new frequency.

3. The method according to claim 2 further comprising the step of detecting an optimum measuring frequency by using a standard coil similar to said electric coil test piece, said optimum measuring frequency lying within a measuring frequency range dependent on the electric coil test piece.

4. The method according to claim 3 wherein the measuring frequency range is detected from a frequency spectrum between approximately 500 Hz and approximately 100 kHz.

5. The method according to claim 1 further comprising the steps of:
    varying the measuring frequency and determining the quality-factor Q of the series resonant circuit; and
    evaluating a value of the quality-factor Q of the series resonant circuit.

6. The method according to claim 5, further comprising the steps of:
    comparing the quality-factor Q of the electric coil test piece with a previously recorded quality-factor Q of a standard coil;
    emitting a signal indicating an interturn fault if the quality-factor Q of the electric coil test piece deviates from the quality-factor Q of the standard coil.

7. The method according to claim 1 further comprising the step of performing an interturn resistance measurement of the electric coil test piece.

8. The method according to claim 7 further comprising the step of comparing a measured value of the quality-factor Q with the interturn resistance measurement.

9. An apparatus for testing an electric coil test piece for interturn and interlayer faults, comprising:
    a series resonant circuit, the electric coil test piece being a component in said resonant circuit;
    a generator, coupled to said resonant circuit, for generating a variable frequency voltage; and
    a measuring system for determining the quality-factor Q of the electric coil test piece, said measuring system being coupled with low capacitance to the resonant circuit.

10. The apparatus according to claim 9 wherein said series resonant circuit comprises a capacitor and said measuring system measures an overshoot voltage on the capacitor.

11. The apparatus according to claim 9 wherein the capacitor of said series resonant circuit is selected to allow the quality-factor Q of said electric coil test piece to attain a maximum value.

12. The apparatus according to claim 9 wherein the generator for the generating the variable frequency is coupled to the resonant circuit with low resistance.

13. The apparatus according to claim 9 wherein the measuring system further comprises a personal computer for sequence control, evaluation of the measured values and indication of the results.

14. A method for testing an electric coil for interturn or interlayer faults comprising the steps of:
    a) coupling the electric coil to a series resonant circuit which includes a variable capacitance;
    b) exciting the series resonant circuit with a signal generator;
    c) sweeping a frequency of the signal generator across a range of frequencies;
    d) determining an optimum frequency ($f_{opt}$), wherein the optimum frequency is defined as a frequency within the range of frequencies at which an overshoot voltage reaches a maximum when the series resonant circuit is in resonance;
    e) storing the overshoot voltage for a combination of optimum frequency ($f_{opt}$) and capacitance;
    f) changing said variable capacitance within a range of capacitances of the series resonant circuit;
    g) repeating steps c) through f) until an overshoot voltage has been measured at each capacitance within the range of capacitances;
    h) determining an optimum capacitance, wherein the optimum capacitance is defined as the capacitance at which the maximum voltage is largest;
    i) changing the capacitances of the series resonant circuit to the optimum capacitance; and
    j) performing a Q-factor measurement by measuring the overshoot voltage at the optimum frequency when the series resonant circuit is in resonance.

* * * * *